(12) United States Patent
Lee et al.

(10) Patent No.: US 12,288,837 B2
(45) Date of Patent: Apr. 29, 2025

(54) SEMICONDUCTOR LIGHT EMITTING DEVICE PACKAGE

(71) Applicant: Samsung Electronics Co., Ltd., Suwon-si (KR)

(72) Inventors: Junghun Lee, Suwon-si (KR); Kyoungjun Kim, Yongin-si (KR); Seolyoung Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 686 days.

(21) Appl. No.: 17/569,323

(22) Filed: Jan. 5, 2022

(65) Prior Publication Data

US 2022/0320397 A1 Oct. 6, 2022

(30) Foreign Application Priority Data

Mar. 31, 2021 (KR) .................. 10-2021-0041827

(51) Int. Cl.
*H01L 33/62* (2010.01)
*H01L 33/56* (2010.01)
*H01L 33/60* (2010.01)

(52) U.S. Cl.
CPC ............. *H01L 33/62* (2013.01); *H01L 33/56* (2013.01); *H01L 33/60* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| JP | 2014022699 A | 2/2014 |
| JP | 2019102631 A | 6/2019 |

(Continued)

*Primary Examiner* — Michelle Mandala
*Assistant Examiner* — Jordan M Klein
(74) *Attorney, Agent, or Firm* — FINNEGAN, HENDERSON, FARABOW, GARRETT & DUNNER LLP

(57) ABSTRACT

A semiconductor light emitting device package, includes: a ceramic substrate having first and second electrode structures; a light emitting diode chip mounted on the ceramic substrate, electrically connected to the first and second electrode structures, and configured to emit ultraviolet light; a sidewall structure disposed on the ceramic substrate, providing a cavity surrounding the light emitting diode chip, and including an alloy having a thermal expansion coefficient in a range of 2 to 10 ppm/° C. and a Young's modulus in a range of 100 to 300 Gpa; and a glass cover disposed on the sidewall structure to seal the cavity.

20 Claims, 14 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,821,129 B2 | 10/2010 | Ives |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,148,738 B2 | 4/2012 | Murayama et al. |
| 8,179,938 B2 | 5/2012 | Kim |
| 8,194,305 B2 | 6/2012 | Maeda et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,564,569 B1 | 2/2017 | Wang et al. |
| 10,333,025 B1 | 6/2019 | Park et al. |
| 10,483,433 B2 | 11/2019 | Park et al. |
| 10,770,626 B2 | 9/2020 | Tischler et al. |
| 10,862,004 B2 | 12/2020 | Park et al. |
| 2009/0295265 A1* | 12/2009 | Tabuchi ............ H01L 33/56 313/112 |
| 2012/0267671 A1* | 10/2012 | Jung ............ H01L 33/486 257/E33.058 |
| 2013/0234274 A1* | 9/2013 | Kam ............ H01L 33/58 257/432 |
| 2020/0303606 A1 | 9/2020 | Kitagawa et al. |
| 2022/0029065 A1* | 1/2022 | Uratani ............ H01L 33/58 |

FOREIGN PATENT DOCUMENTS

| | | |
|---|---|---|
| KR | 1020190070533 A | 6/2019 |
| KR | 1020190073908 A | 6/2019 |
| KR | 1020190073909 A | 6/2019 |

* cited by examiner

SEMICONDUCTOR LIGHT EMITTING DEVICE PACKAGE

CROSS-REFERENCE TO RELATED APPLICATION(S)

This application claims benefit of priority to Korean Patent Application No. 10-2021-0041827 filed on Mar. 31, 2021 in the Korean Intellectual Property Office, the disclosure of which is incorporated herein by reference in its entirety.

BACKGROUND

The present inventive concept relates to a semiconductor light emitting device package.

Semiconductor light emitting devices are known as next-generation light sources that have advantages such as a longer lifespan, lower power consumption, faster response speeds, environmental friendliness, and the like, as compared to conventional light sources. Such semiconductor light emitting devices are attracting attention not only as lighting sources for general lighting devices, display devices, electric lamps, and the like, but also as various functional light sources for tasks such as sterilization, growth promotion, and bio.

Such semiconductor light emitting devices benefit from a reliable package structure to improve heat dissipation performance as well as light extraction efficiency.

SUMMARY

An aspect of the present inventive concept is to provide a semiconductor light emitting device package having excellent heat dissipation performance and sealing properties.

According to an aspect of the present inventive concept, a semiconductor light emitting device package includes: a ceramic substrate having first and second electrode structures; a light emitting diode chip mounted on the ceramic substrate, electrically connected to the first and second electrode structures, and configured to emit ultraviolet light; a sidewall structure disposed on the ceramic substrate, providing a cavity surrounding the light emitting diode chip, and including an alloy having a thermal expansion coefficient in a range of 2 to 10 ppm/° C. and a Young's modulus in a range of 100 to 300 Gpa; and a glass cover disposed on the sidewall structure to seal the cavity.

According to an aspect of the present inventive concept, a semiconductor light emitting device package includes: a ceramic substrate having first and second electrode structures; a light emitting diode chip mounted on the ceramic substrate, electrically connected to the first and second electrode structures, and configured to emit ultraviolet light; a sidewall structure disposed on the ceramic substrate, and providing a cavity surrounding the light emitting diode chip, the sidewall structure including an alloy having a thermal expansion coefficient in a range of 2 to 10 ppm/° C. and a Young's modulus in a range of 100 to 300 Gpa; a first hermetic seal bonding layer disposed between a lower surface of the sidewall structure and an upper surface of the ceramic substrate; a glass cover disposed on the sidewall structure, and including a glass material having a coefficient thermal expansion coefficient in a range of 0.5 to 4 ppm/° C.; and a second hermetic seal bonding layer disposed between an upper surface of the sidewall structure and the glass cover.

According to an aspect of the present inventive concept, a semiconductor light emitting device package includes: a circuit board having a ceramic body including an aluminum nitride, and having first and second electrode pads and a support pad, the support pad surrounding the first and second electrode pads, wherein the first and second electrode pads and the support pad are formed on an upper surface of the main body; a light emitting diode chip mounted on the circuit board, electrically connected to the first and second electrode pad, and configured to emit ultraviolet light; a sidewall structure disposed on the circuit board, providing a cavity surrounding the light emitting diode chip, and including any one of an Fe—Ni alloy, an Fe—Ni—Co alloy, and CuW; and a glass cover disposed on the sidewall structure to seal the cavity, wherein the cavity has an internal space sealed by a first hermetic seal bonding layer disposed between an upper surface of the support pad and a lower surface of the sidewall structure and a second hermetic seal bonding layer disposed between an upper surface of the sidewall structure and the glass cover.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
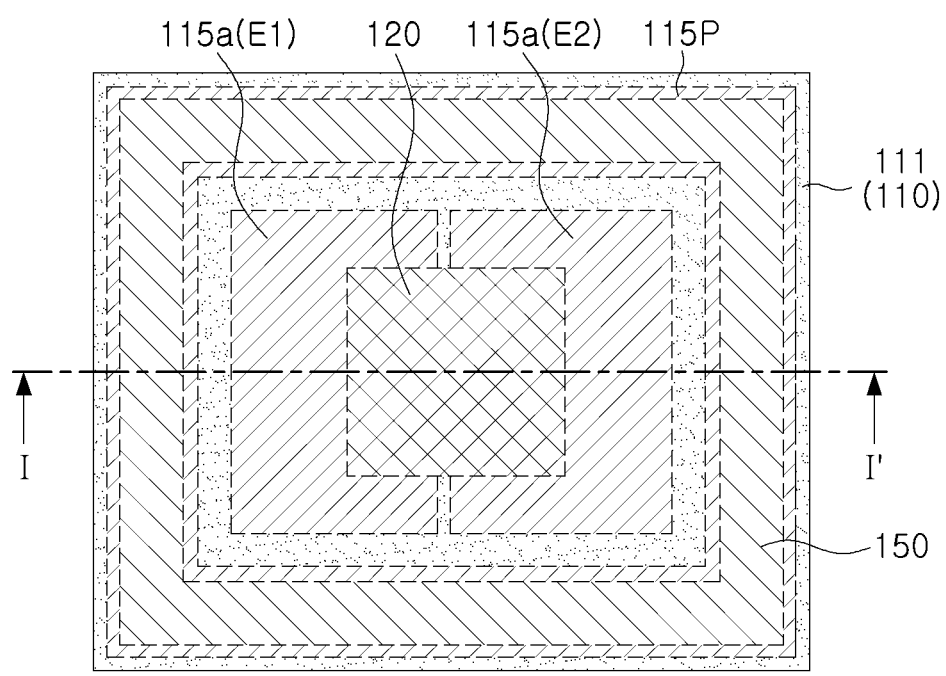
FIG. 1 is a plan view of a semiconductor light emitting device package according to an example embodiment of the present inventive concept.
Figure 2:
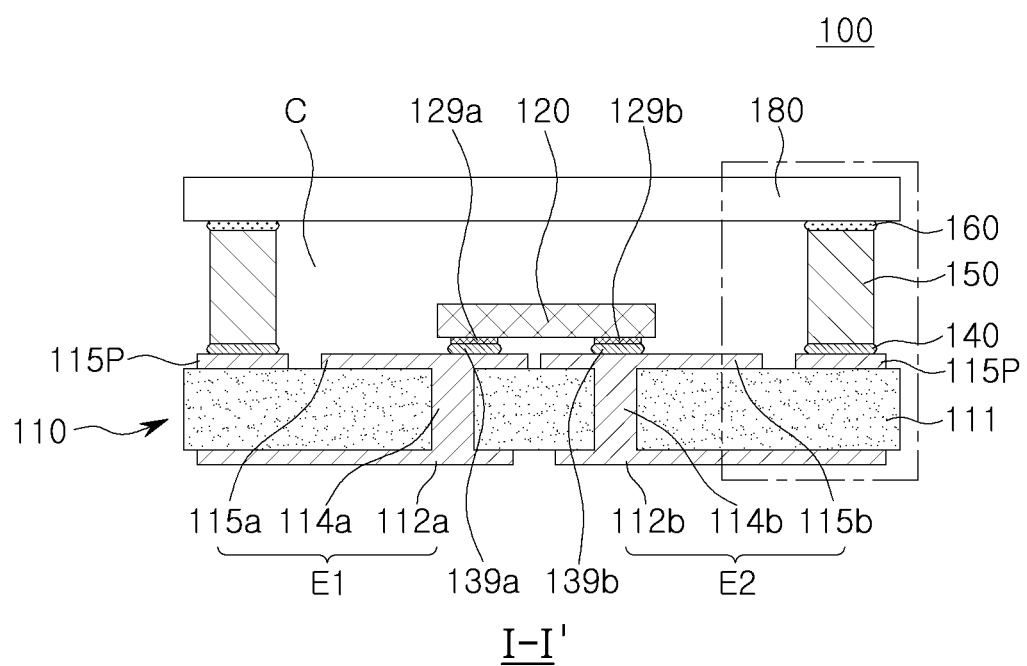
FIG. 2 is a side cross-sectional view of the semiconductor light emitting device package shown in FIG. 1 taken along line I-I'.

FIG. 1 is a plan view of a semiconductor light emitting device package according to an example embodiment of the present inventive concept, and FIG. 2 is a side cross-sectional view of the semiconductor light emitting device package shown in FIG. 1.

Referring to FIGS. 1 and 2, a semiconductor light emitting device package 100 according to the present example embodiment may include a circuit board 110 having first and second electrode structures E1 and E2, a light emitting diode (LED) chip 120 mounted on the circuit board 110 and electrically connected to the two electrode structures E1 and E2, a sidewall structure 150 disposed on the circuit board 110 and providing a cavity C surrounding the LED chip 120, and a glass cover 180 disposed on the sidewall structure 150 to seal the cavity C. A light emitting diode may be generally referred to herein as a light emitting device.

The circuit board 110 includes a plate-shaped ceramic body 111 having excellent heat dissipation performance. In this specification, the circuit board 110 is also referred to as a "ceramic substrate" in order to emphasize constituent materials of a body. The ceramic body 111 may include a ceramic material having thermal conductivity of 100 W/m·K or more. For example, the ceramic body 111 may include or may be aluminum nitride, aluminum oxide, or silicon carbide. In some example embodiments, aluminum nitride may be used as the ceramic body 111, and the aluminum nitride may ensure high thermal conductivity of 150 W/m·K or more.

The first and second electrode structures E1 and E2 may include first and second upper pads 115a and 115b disposed on an upper surface of the ceramic body 111, respectively, first and second lower pads 112a and 112b disposed on a lower surface of the ceramic body 111, and first and second through electrodes 114a and 114b penetrating through the ceramic body 111 and respectively connecting the first and second upper pads 115a and 115b to the first and second lower pads 112a and 112b. For example, the first and second upper pads 115a and 115b, the first and second through electrodes 114a and 114b, and the first and second lower pads 112a and 112b may include or may be a single-layered or multi-layered structure of conductive materials such as Au, Ag, Cu, Zn, Al, In, Ti, Si, Ge, Sn, Mg, Ta, Cr, W, Ru, Rh, Ir, Ni, Pd, and Pt. A pad, as described herein, refers to a conductive component having plate-like shape and having a flat external surface to which another electrical component can be connected.

In some example embodiments, the first and second upper pads 115a and 115b, the first and second through electrodes 114a and 114b, and the first and second lower pads 112a and 112b may be separately manufactured, respectively (e.g., in three separate deposition or formation processes). However, in another example embodiment, they may be manufactured at once (e.g., together) through a batch process. For example, the first and second electrode structures E1 and E2 may be formed by a plating process using a metal such as copper (Cu). In addition, for example, the first and second upper pads 115a and 115b may include a Cu plating layer and Au/Ni or Au/Pd/Ni stacked on the Cu plating layer. A support pad 115P surrounding the LED chip 120 may be disposed on (e.g., directly on) the upper surface of the ceramic body 111. The support pad 115P may be formed together with the first and second upper pads 115a and 115b. For example, the support pad 115P may include the same metal layer as a metal layer of the first and second upper pads 115a and 115b. Here, the first and second upper pads 115a and 115b are pads for connecting to electrodes of the LED chip, and are also referred to as "first and second electrode pads", respectively. The support pad 115P may be described as a dummy pad, as it is connected so that it does not transmit an electrical signal to a further component used for signal or voltage transmission.

The LED chip 120 may include first and second electrodes 129a and 129b disposed on one surface facing the upper surface of the circuit board 110. The first and second electrodes 129a and 129b of the LED chip 120 may be respectively connected to the first and second upper pads 115a and 115b by connection bumps 139a and 139b. The LED chip 120 may be configured to emit light of a specific wavelength band. In some example embodiments, the LED chip 120 may be configured to emit ultraviolet light (100 nm to 400 nm). A structure of such an ultraviolet LED chip will be described later with reference to FIG. 4. In certain instances, the LED chip 120 may be configured to emit seam ultraviolet (UV-C) light for sterilization and disinfection. Such seam ultraviolet light may have a wavelength of 100 nm to 300 nm. Since the ultraviolet light photodecomposes a resin such as silicone or epoxy, there may be restrictions in employing an encapsulant and a bonding layer as a package component.

The glass cover 180 may be used as an element replacing the encapsulant. The glass cover 180 may be formed of a material having a transmittance of 70% or more (in some example embodiments, 85% or more) in a wavelength band of 200 nm to 300 nm. For example, the glass cover 180 may include or may be quartz, fused silica glass, calcium fluoride glass ($CaF_2$ glass), magnesium fluoride glass, or borosilicate glass. In some example embodiments, the glass cover may have a thermal expansion coefficient of 4 ppm/° C. or less (for example, in a range of 0.5 to 4 ppm/° C.).

The sidewall structure 150 is disposed on the circuit board 110, and has a cavity C surrounding the LED chip 120. The sidewall structure 150 may be respectively bonded to the circuit board 110 and the glass cover 180. Such bonding may be implemented by first and second hermetic seal bonding layers 140 and 160. The bonded sidewall structure 150 may be used as a support structure in which the glass cover 180 maintains a constant distance from the circuit board 110. As described above, the cavity C by the sidewall structure 150 may be provided as a mounting space for the sealed LED chip 120 to prevent penetration of external moisture, or the like. The cavity C may be filled with air or gas. For example, the cavity may be an internal space formed such that no solid material is located between a top surface of the LED chip 120 and the glass cover 180, and/or between side surfaces of the LED chip 120 and inner side surfaces of the sidewall structure 150.

The sidewall structure 150 may be formed of a material having an appropriate thermal expansion coefficient to maintain reliable bonding between the ceramic material of the circuit board 120 and the glass material of the glass cover 180. For the sidewall structure 150, an alloy having a thermal expansion coefficient of 10 ppm/° C. or less may be used. When the thermal expansion coefficient thereof exceeds 10 ppm/° C., it has a large difference from the thermal expansion coefficient (e.g., 4.0 ppm/° C. or less) of the glass cover 180, so that defects may occur in the glass cover 180 and/or the second hermetic seal bonding layer 160 having large fracture toughness, thereby greatly reducing reliability of the package. In some example embodiments, a thermal expansion coefficient of an alloy constituting the sidewall structure 150 is in a range of 2 to 10 ppm/° C. (e.g., has a value of 2 to 10 ppm/° C.), and in certain example embodiments, the thermal expansion coefficient thereof may be in a range of 2 to 8 ppm/° C. (e.g., has a value of 2 to 8 ppm/° C.).

The sidewall structure 150 may have a relatively lower Young's modulus than that of a ceramic material (e.g., AlN: about 320 GPa) so that stress caused by mismatching of the thermal expansion coefficients is alleviated. The sidewall structure 150 may include an alloy having a Young's modulus of 300 Gpa or less. In some example embodiments, the sidewall structure 150 may include or be formed of an alloy having a Young's modulus in a range of 100 to 300 Gpa, and in certain example embodiments, the sidewall structure 150 may include or be formed of an alloy having a Young's modulus in a range of 100 to 200 Gpa. For example, the sidewall structure 150 may include or be formed of at least one of an Fe—Ni alloy, a Fe—Ni—Co alloy, and CuW. Such an alloy may satisfy the thermal expansion coefficient and conditions for package reliability as shown in Table 1 below. An Invar alloy may be used as the Fe—Ni alloy, and a Kovar alloy may be used as the Fe—Ni—Co alloy.

TABLE 1

| Alloy of sidewall structure | Invar | Kovar | CuW |
|---|---|---|---|
| Thermal expansion coefficient (ppm/° C.) | 1.2 | 5 | 8.3 |
| Young's modulus (Gpa) | 137-145 | 138 | 280 |

Figure 3:
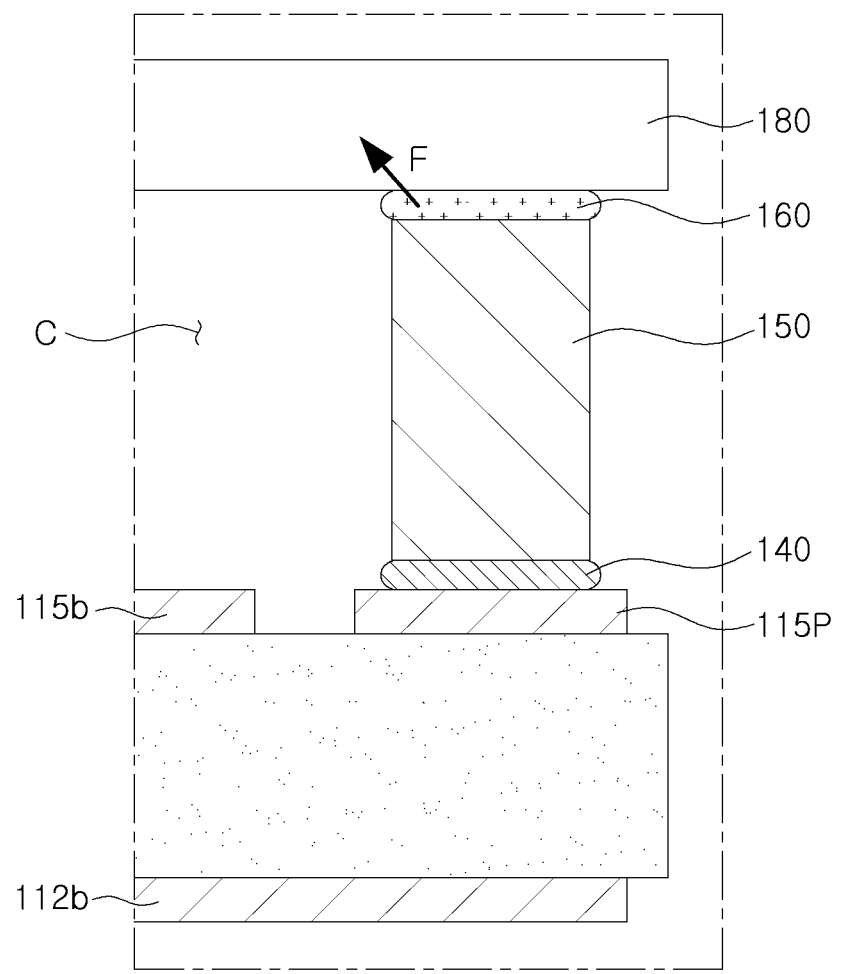
FIG. 3 is an enlarged cross-sectional view of a partial region of the semiconductor light emitting device package shown in FIG. 2.

Since the sidewall structure 150 positioned between the circuit board 110, which is a ceramic material, and the glass cover 180, has the above-described conditions of the thermal expansion coefficient and Young's modulus, thermal stress can be greatly alleviated to stably maintain the reliability of the package. The sidewall structure 150 is also described herein as a wall, or a vertical support, which in at least the embodiment of FIGS. 1 and 2, surrounds the LED chip (e.g., surrounds all sides of the LED chip) and extends vertically to be perpendicular to a top surface of the circuit board 110. FIG. 3 is an enlarged cross-sectional view of region "A" of the semiconductor light emitting device package shown in FIG. 2.

Referring to FIG. 3, in the sidewall structure 180 according to the present example embodiment, since there is no large difference between a thermal expansion coefficient (e.g., AlN: about 4.4 ppm/° C.) of the circuit board 110 having excellent heat dissipation performance and a thermal expansion coefficient of the glass cover 180 (e.g., 4 ppm/° C. or less), an effect on thermal stress can be reduced. In addition, even when residual stress ("F") with the glass cover with low fracture toughness occurs, the sidewall structure 180 has a Young's modulus lower than the Young's modulus of the ceramic material (a Young's modulus of 300 Gpa or less, for example, 100 to 300 Gpa). Therefore, damage to the glass cover can be minimized.

As described above, the light emitting device package 100 according to the present example embodiment may include first and second hermetic seal bonding layers 140 and 160 to provide the cavity C as a sealed space.

The first hermetic seal bonding layer 140 may be disposed between the support pad 115P and the lower surface of the sidewall structure 150 to bond the circuit board 110 and the sidewall structure 150 to each other. For example, the first hermetic seal bonding layer 140 may include brazing, welding, or soldering. For example, an Ag-based filler may be used for brazing, and Ni/Au may be used for welding. In addition, as the soldering method, a eutectic metal such as Au/Ge, Au/In, or Au/Sn may be used.

The second hermetic seal bonding layer 160 may be disposed between an upper surface of the sidewall structure 150 and an edge region of the glass cover 180 so that the sidewall structure 150 and the glass cover 180 are bonded to each other. For example, the second hermetic seal bonding layer 160 may include solder (e.g., a eutectic metal such as Au/Ge, Au/In, or Au/Sn) or glass frit. When solder is used as the second hermetic seal bonding layer 160, a metal pattern may be formed in a bonding region of the glass cover 180. In some example embodiments, a bonding material such as silicone and epoxy may be used as the second hermetic seal bonding layer 160. Stress due to mismatching of thermal expansion coefficients may be released by an elastic modulus of a resin-based bonding layer. However, when an LED chip for UV-C light is used as the LED chip 120, glass frit or solder may be used.

Figure 4:
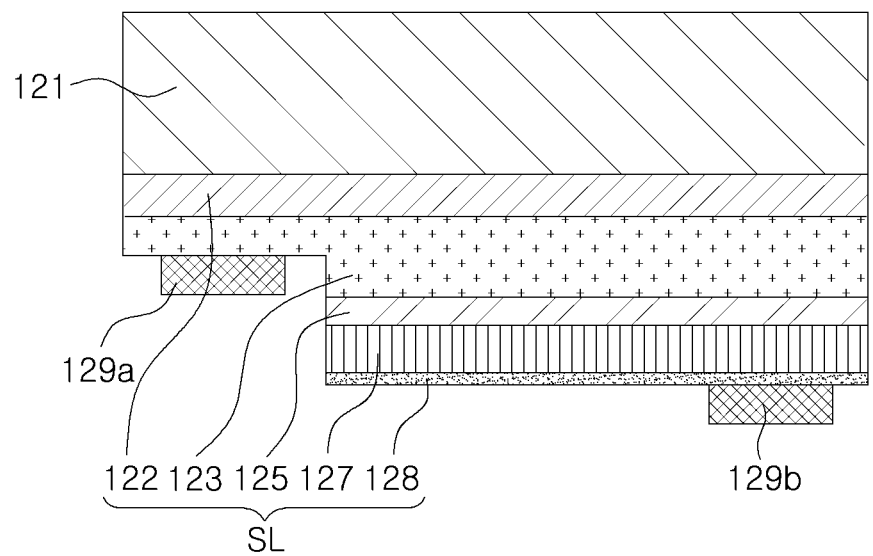
FIG. 4 is a cross-sectional view illustrating an ultraviolet LED employable in a semiconductor light emitting device package according to an example embodiment of the present inventive concept.

FIG. 4 is a cross-sectional view illustrating an ultraviolet LED chip employable in a semiconductor light emitting device package according to an example embodiment of the present inventive concept.

An ultraviolet LED chip 120 employable in the present example embodiment includes a substrate 121 and a semiconductor laminate SL disposed on the substrate 121 and configured to emit ultraviolet light. The semiconductor laminate SL includes first and second conductivity-type semiconductor layers 123 and 127, and an active layer 125 disposed between the first and second conductivity-type semiconductor layers 123 and 127.

The substrate 121 is a growth substrate for the semiconductor laminate SL, and may be an insulating, conductive, or semiconductor substrate. For example, the substrate 121 may be sapphire, SiC, Si, $MgAl_2O_4$, MgO, $LiAlO_2$, $LiGaO_2$, and GaN. The semiconductor laminate SL employed in the present example embodiment may include a buffer layer 122 for growing a high-quality AlGaN semiconductor on the substrate 121. For example, the buffer layer 122 may be formed of a nitride such as AlN or AlGaN. The first conductivity-type semiconductor layer 123 may be an n-type nitride semiconductor represented by $Al_{x1}Ga_{1-x1}N$ ($0<x1<1$), and the n-type impurity may be Si. For example, the first conductivity-type semiconductor layer 123 may be n-type AlGaN. The second conductivity-type semiconductor layer 127 may be a p-type nitride semiconductor represented by $Al_{x2}Ga_{1-x2}N$ ($0<x2<1$), and the p-type impurity may be Mg. For example, the second conductivity-type semiconductor layer 127 may include p-type AlGaN. In an example, Al composition ratios (x1 and x2) of each of the first and second conductivity-type semiconductor layers 123 and 127 may be in a range of 0.45 to 0.99, and furthermore, in some embodiments, the Al composition ratio of the first conductivity-type semiconductor layers 123 (x1) may be in a range of 0.60 to 0.65, and the Al composition ratio (x2) of the second conductivity-type semiconductor layer 127 may be in a range of 0.75 to 0.85.

The active layer 125 employed in the present example embodiment may have a quantum well made of $Al_{x3}Ga_{1-x3}N(0<x3<1)$. The active layer 125 may be a single-quantum well (SQW) structure having one quantum well, but is not limited thereto, and the active layer 25 may be a multiple-quantum well (MQW) structure in which a plurality of quantum well layers made of $Al_{xa}Ga_{1-xa}N(0<xa<1)$ and a quantum barrier layers made of $Al_{xb}Ga_{1-xb}N(xa<xb<1)$ are alternately stacked.

The quantum well of the active layer 125 has a band gap determining a wavelength of ultraviolet light, and the active layer 125 employed in the present example embodiment may be configured to emit light having a wavelength of 100 nm to 400 nm, or a wavelength of 100 nm to 300 nm. The first and second conductivity-type semiconductor layers 123 and 127 have a band gap, greater than that of the quantum well so that ultraviolet light generated from the active layer 125 is not absorbed. For example, an Al composition ratio (x3 or xa) of the quantum well may be smaller than Al composition ratios (x1 and x2) of the first and second conductivity-type semiconductor layers 123 and 127. In one example, the Al composition ratio (x3 or xa) of the quantum well may be in a range of 0.4 to 1.00, and the Al composition ratio may be adjusted according to a desired wavelength.

When the second conductivity-type semiconductor layer 127 is made of p-type AlGaN, since it is difficult to form an ohmic contact with a common electrode material, a semiconductor laminate SL employed in the present example embodiment may include a second conductivity-type contact layer 128 formed on the second conductivity-type semiconductor layer 127 and having a relatively low band gap. The Al composition ratio of the second conductivity-type contact layer 128 is smaller than the Al composition ratio (x2) of the second conductivity-type semiconductor layer 127, and may include, for example, p-type GaN.

The ultraviolet LED chip 120 according to the present example embodiment includes first and second electrodes 129a and 129b respectively connected to the first and second conductivity-type semiconductor layers 123 and 127. The semiconductor laminate SL has a region in which the second conductivity—type semiconductor layer 127 and the active layer 125 are partially removed to expose a region of the first conductivity-type semiconductor layer 123. The first electrode 129a may be disposed on an exposed region of the first conductivity-type semiconductor layer 123. For example, the first and second electrodes 129a and 129b may have a multilayer structure formed of Al, Ti, Ni, Cr, Au, Ag, ITO, or a combination thereof. For example, the first electrode 129a may be formed of or may include Ti/Al/Ni/Au, and the second electrode 129b may be formed of or may include Ag or Ni/Au.

In addition to the ultraviolet LED chip shown in FIG. 4, LED chips having various structures may be used. For example, the ultraviolet LED chip or device described in Korean Patent Application 10-2017-0175149 (Application Date: 2017 Dec. 19, Applicant: Samsung Electronics Co., Ltd., corresponding to U.S. patent Ser. No. 10/333,025 B1), Korean Patent Application No. 10-2017-0171131 (application date: Dec. 13, 2017, Applicant: Samsung Electronics Co., Ltd., corresponding to U.S. patent Ser. No. 10/862,004 B2), and Korean Patent Application No. 10-2017-0171131 (application date: Dec. 13, 2017, applicant: Samsung Electronics Co., Ltd., corresponding to U.S. patent Ser. No. 10/862,004 B2), may be used as the semiconductor light emitting device according to the present example embodiment. The disclosures of each of these six documents are hereby incorporated by reference in their entirety.

Figure 5:
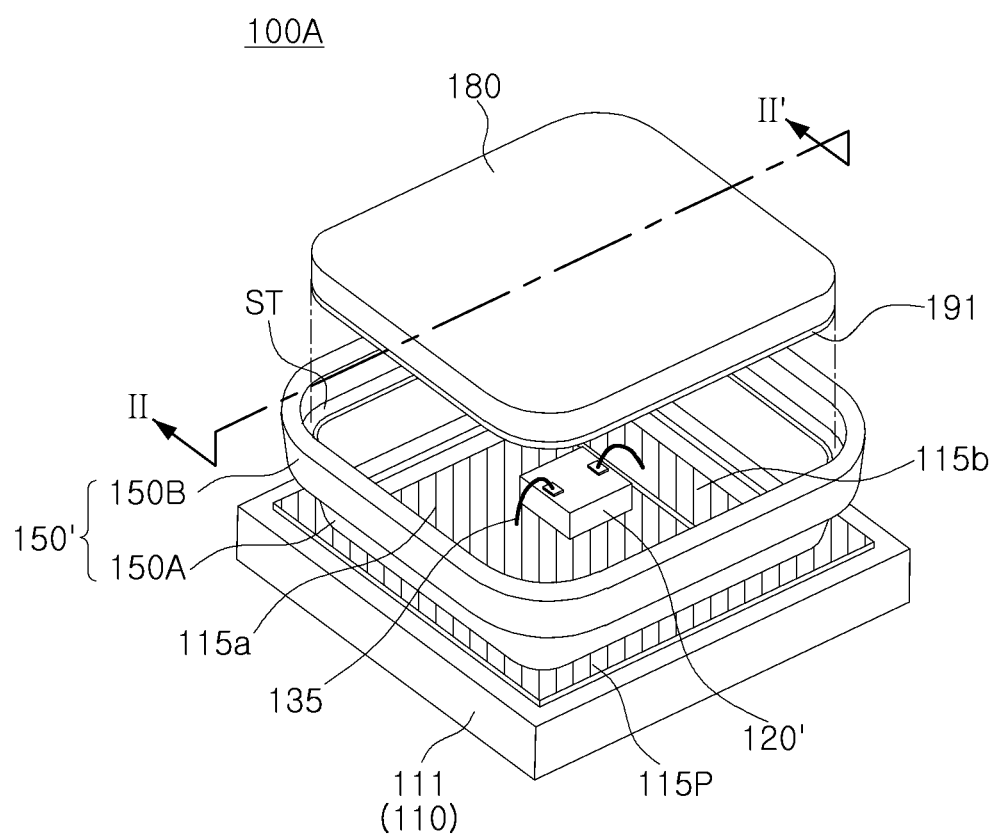
FIG. 5 is a perspective view of a semiconductor light emitting device package according to an example embodiment of the present inventive concept.
Figure 6:
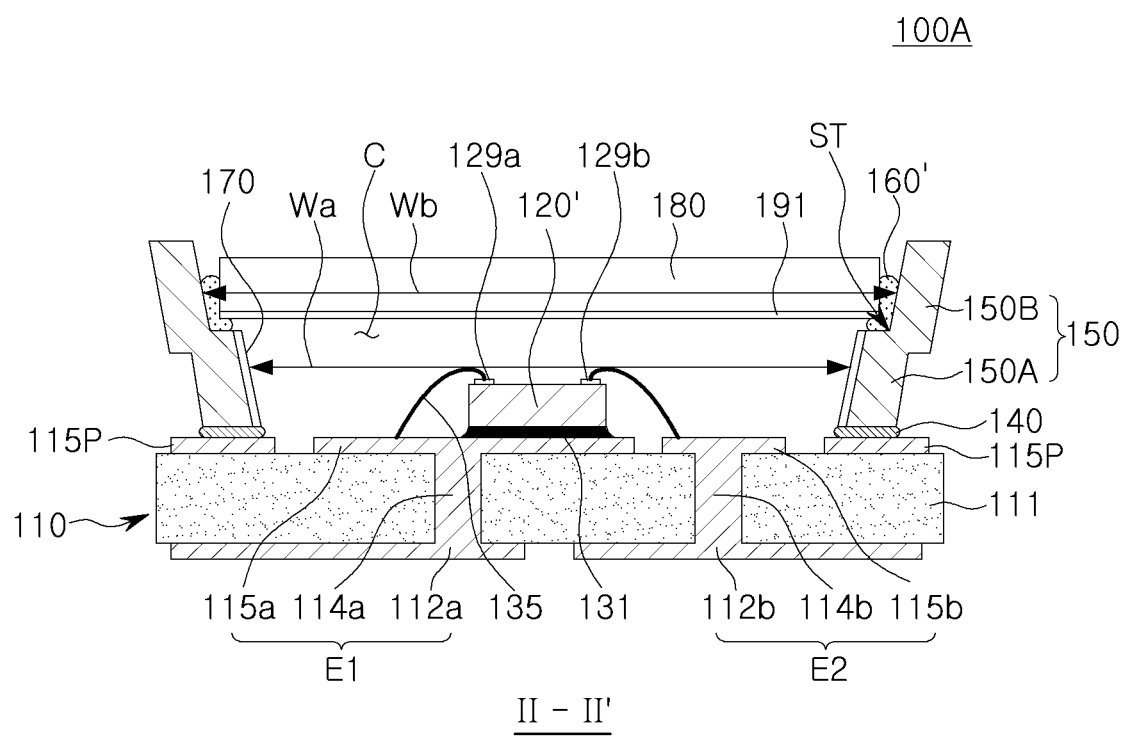
FIG. 6 is a side cross-sectional view of the semiconductor light emitting device package shown in FIG. 5 taken along II-II'.

FIG. 5 is a perspective view of a semiconductor light emitting device package according to an example embodiment of the present inventive concept, and FIG. 6 is a side cross-sectional view of the semiconductor light emitting device package shown in FIG. 5 taken along line II-Ir.

Referring to FIGS. 5 and 6, it can be understood that the semiconductor light emitting device package 100A according to the present example embodiment is similar to the semiconductor light emitting device package 100 shown in FIGS. 1 to 3, except that a sidewall structure 150' having an inclined structure is employed, and an anti-reflective film 191 is reflected on one surface of the glass cover 180, and a connection method of the LED chip 120' is different therefrom. The description of the components of the present example embodiment may refer to the description of the same or similar components of the semiconductor light emitting device package 100 shown in FIGS. 1 to 3 unless otherwise specifically stated. The sidewall structure 150' is also described herein as a wall, or an inclined support, which in at least the embodiment of FIGS. 5 and 6, surrounds the LED chip (e.g., surrounds all sides of the LED chip) and extends to be inclined or slanted with respect to the top surface of the circuit board 110, so to not be perpendicular to the top surface of the circuit board 110.

The sidewall structure 150' employed in the present example embodiment may have an inclined inner sidewall. The sidewall structure 150' includes a first sidewall portion 150A having a first inner width Wa, and a second inner portion connected to the first sidewall portion 150A and having a second inner width Wb, greater than the first inner width Wa. Each of the width Wa and width Wb may increase in a direction away from the circuit board 110. For example, the first sidewall portion 150A may have inner surfaces, such that two inner surfaces are opposite each other and are inclined such that in a direction away from the top of the circuit board 110, a width between the two inner surfaces increases. The same may apply for the second sidewall portion 150B for width Wb. In the present example embodiment, it is illustrated that both the first and second sidewall portions 150A and 150B have an inclined form, but in some example embodiments, only the first sidewall portion 150A may be inclined upwardly, and the second sidewall portion 150B may be substantially vertical. Terms such as "perpendicular," "parallel," "vertical," "horizontal," "same," "equal," "planar," or "coplanar," as used herein encompass exact or near exact meanings, including variations that may occur, for example, due to manufacturing processes. The term "substantially" may be used herein to emphasize this meaning, unless the context or other statements indicate otherwise The sidewall structure 150' may have a stepped structure ST surrounding the cavity C using the first and second sidewall portions 150A and 150B having different widths. The glass cover 180 may be disposed on the stepped structure ST. For example, the glass cover 180 may be disposed on a horizontally-extending step formed between the first sidewall portion 150A and the second sidewall portion 150B, such that the step forms a supporting floor beneath the glass cover 180.

The sidewall structure 150' employed in the present example embodiment may include a reflective layer 170 positioned on at least a partial region of the inclined inner sidewall. In the present example embodiment, a reflective layer 170 may be formed only on the inner sidewall of the first sidewall portion 150A (e.g., it may be formed on an inner sidewall surface of only the first sidewall portion 150A), thereby providing a main reflective surface, but is not limited thereto. The reflective layer 170 may include or be formed of at least one of Al, Au, Ag, and Teflon® (e.g., polytetrafluoroethylene, or PTFE). In another example embodiment, the reflective layer 170 may include or be formed of an insulating reflective layer. For example, the reflective layer 170 may include a DBR structural layer in which an insulating material with high reflectivity (e.g., a white reflective film) such as $TiO_2$, $SiO_2$, SiN, $Si_3N_4$, $Al_2O_3$, TiN, AlN, $ZrO_2$, TiAlN, TiSiN, and $Nb_2O_3$, or a dielectric layer having different refractive indices are alternately deposited.

An anti-reflective film 191 may be formed on a lower surface of the glass cover 180. For example, when the LED chip 120' emits seam ultraviolet light, a thickness of the anti-reflective film 191 is in a range of 30 nm to 100 nm, and a refractive index of the anti-reflective film 191 may be in a range of 1.2 to 2.5. In some example embodiments, a material having a refractive index, close to 1.4 (e.g., $MgF_2$) may be used as the anti-reflective film 191. In another example embodiment, the anti-reflective film 191 may include a first layer having a first refractive index and a second layer having a second refractive index, lower than the first refractive index. For example, the first layer may be any one of $ZrO_2$, $HfO_2$, $CeO_2$, $Ta_2O_5$, $TiO_2$, $Ti_2O_3$, $Ti_3O_5$, ZnS, and ZnSe, and the second layer may be any one of $CaF_2$, $LaF_3$, $MgF_2$, $Na_3A_1F_6$, $SiO_2$, and $Al_2O_3$. For example, in the case of the anti-reflective film 191 for improving UV transmittance, the first and second layers may be an $MgF_2$ film and an $HfO_2$ film, respectively. The LED chip 120' employed in this embodiment may be mounted on the first upper pad 115a using a bonding layer 131, and the first and second electrodes facing upwardly may be connected to the first and second upper pads 115a and 115b, respectively through a wire 135. The second hermetic seal 160' may be different from that of FIGS. 1-3. For example, the hermetic seal may be partly on a bottom surface of the glass cover 180 and the step, and may be partly on a side surface of the glass cover 180 and a sidewall surface of the second sidewall portion 150B. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 7:
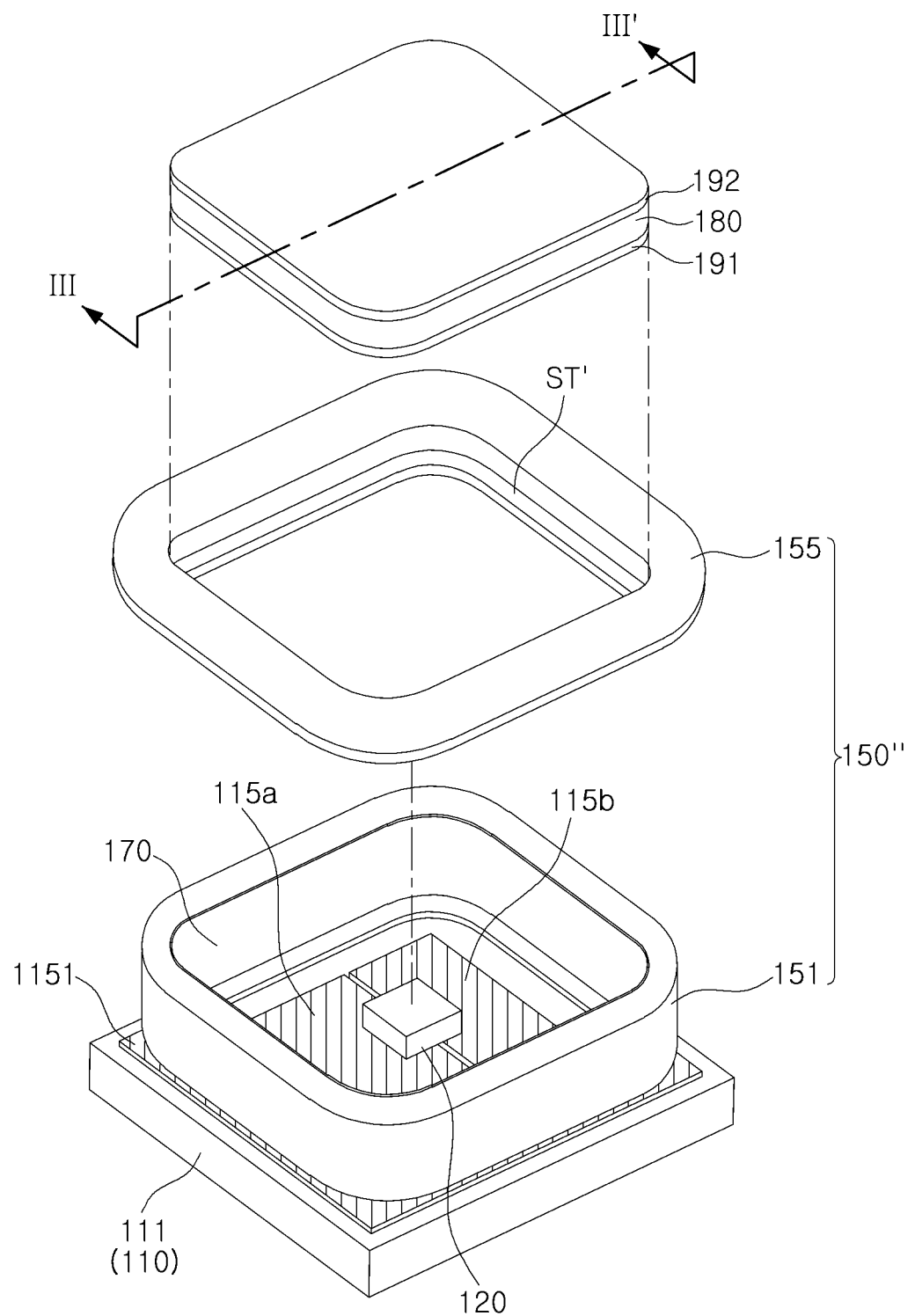
FIG. 7 is an exploded perspective view of a semiconductor light emitting device package according to an example embodiment of the present inventive concept.
Figure 8:
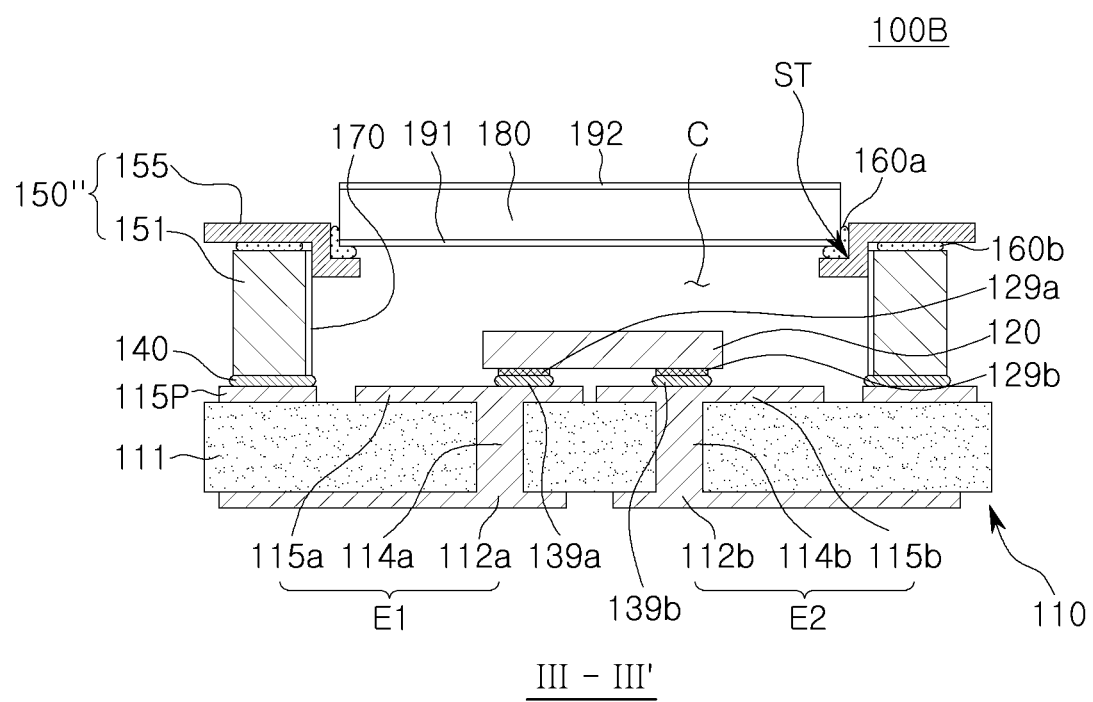
FIG. 8 is a side cross-sectional view of the semiconductor light emitting device package shown in FIG. 7 taken along line III-III'.

FIG. 7 is an exploded perspective view of a semiconductor light emitting device package according to an example embodiment of the present inventive concept, and FIG. 8 is a side cross-sectional view of the semiconductor light emitting device package shown in FIG. 7 taken along line III-III'.

Referring to FIGS. 7 and 8, it can be understood that the semiconductor light emitting device package 100B is similar to the semiconductor light emitting device package 100 shown in FIGS. 1 to 3, except that a sidewall structure 150" having a two-stage structure is employed and first and second anti-reflective films 191 and 192 are formed on both surfaces of the glass cover 180, respectively. The description of the components of the present example embodiment may refer to the description of the same or similar components of the semiconductor light emitting device package 100 shown in FIGS. 1 to 3 unless otherwise specifically stated.

The sidewall structure 150" employed in the present example embodiment may include a main sidewall portion 151 and a locking jaw portion 155 disposed on an upper end of the main sidewall portion 151, unlike the integrated sidewall structures 150 and 150' of the previous embodiments. In the present example embodiment, the main sidewall portion 151 is illustrated as having a substantially vertical structure, but may be configured to have an inclined inner sidewall. The locking jaw portion 155 may be attached to the upper end of the main sidewall portion 151 using a third hermetic seal bonding layer 160b. In some example embodiments, glass frit or solder may be used as the third hermetic seal bonding layer 160b, similar to the previous example embodiments.

The locking jaw portion 155 may have a stepped structure ST surrounding the cavity C. The glass cover 150" may be disposed on the stepped structure ST of the locking jaw portion 155. In some example embodiments, glass frit or solder may be used as the second hermetic seal bonding layer 160a, similarly to the third hermetic seal bonding layer 160b. In another example embodiment, the second hermetic seal bonding layer 160a may use a resin-based bonding layer (a silicone resin or an epoxy resin) having a larger elastic modulus to protect the glass cover 180. Also, the second hermetic seal bonding layer 160a may be positioned to be disposed on a bottom surface and a side surface of the glass cover 180, and to be on a top surface (or step surface) and a side surface of the locking jaw portion 155. The locking jaw portion 155 may also be described as a ring-shaped stepped platform, or as a ring-shaped stepped bracket, or as a step-shaped mounting plate, or a mounting step.

The sidewall structure 150" employed in the present example embodiment may include a reflective layer 170 positioned on at least a partial region of the inner sidewall. In the present example embodiment, a reflective layer 170 may be formed only on the inner sidewall of the main sidewall portion 151, but it is not limited thereto. The reflective layer 170 may include or may be at least one of Al, Au, Ag, and PTFE. In another example embodiment, the reflective layer 170 may include the above-described insulating reflective layer.

First and second anti-reflective films 191 and 192 may be formed on a lower surface and an upper surface of the glass cover 180, respectively. For example, when the LED chip 120 emits seam ultraviolet light, a refractive indices of the first and second anti-reflective films 191 and 192 may be in a range of 1.2 to 2.5, and a thickness of the first and second anti-reflective films 191 may be in a range of 30 nm to 100 nm, and a thickness of the second anti-reflective film 192 may be in a range of 10 nm to 300 nm. For example, for the first and second anti-reflective films 191 and 192, a material (e.g., $MgF_2$) film having a refractive index, close to 1.4 may be used, respectively, or a double structure of $MgF_2$ and $HfO_2$ may be used.

Figure 9:
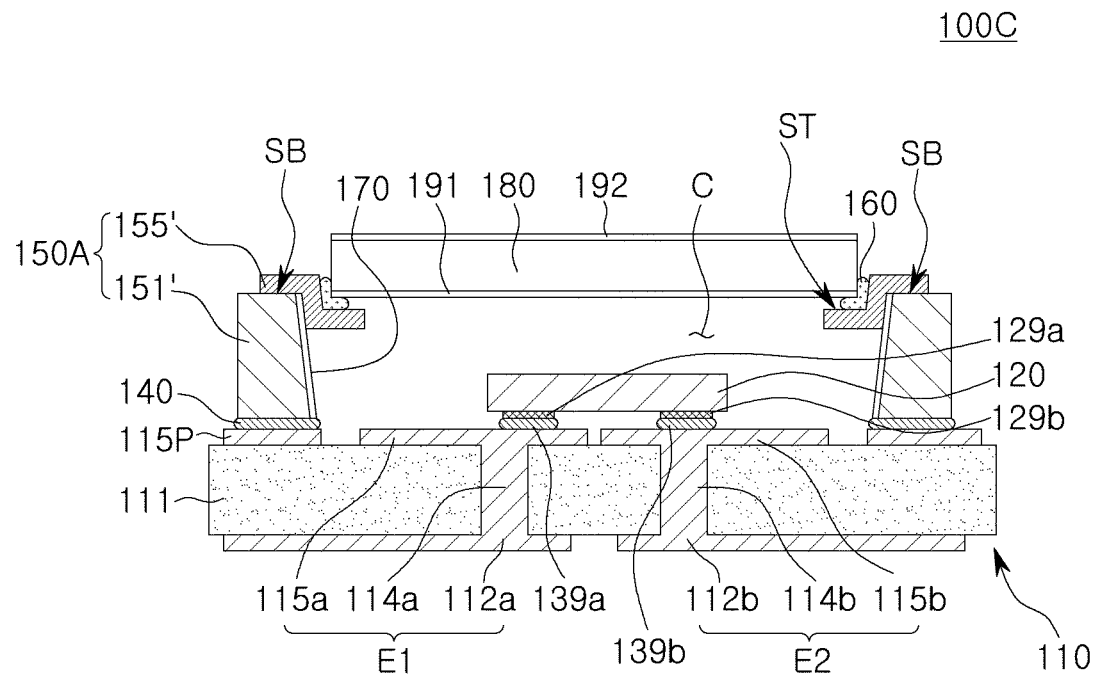
FIG. 9 is a side cross-sectional view of a semiconductor light emitting device package according to an example embodiment of the present inventive concept.

FIG. 9 is a side cross-sectional view of a semiconductor light emitting device package according to an example embodiment of the present inventive concept.

Referring to FIG. 9, it can be understood that a semiconductor light emitting device package 100C is similar to the light emitting device package 100B shown in FIGS. 7 and 8, except that it has a bonding method and structure, different those of a two-stage sidewall structure 150A. The description of the components of the present example embodiment may refer to the description of the same or similar components of the semiconductor light emitting device package 100B shown in FIGS. 7 and 8 unless otherwise specifically stated.

Similar to the previous embodiment (refer to FIGS. 7 and 8), the sidewall structure 150A employed in this embodiment has a main sidewall portion 151' and a locking jaw portion 155' disposed at a front end of the main sidewall portion 151', but in the present example embodiment, the main sidewall portion 151' may be configured to have an inclined inner sidewall surface. In addition, unlike the previous embodiment, the main sidewall portion 151' of the sidewall structure 150A may be directly bonded, for example, using electrical resistance using a seam sealing or a seam welding process, to the locking jaw portion 155' of the sidewall structure 150A. A separate adhesive material such as the third hermetic seal bonding layer 160b may not exist at a bonding interface between the main side wall portion 151' and the locking jaw portion 155'. A mounting plate, or step surface ST of the locking jaw portion 155' employed in this embodiment may have a relatively small width so as not to deviate from an upper end of the main side wall portion 151' externally.

FIGS. 10 to 14 are plan views for each process for explaining a method of manufacturing a semiconductor light emitting device package according to an example embodiment of the present inventive concept.

Figure 10:
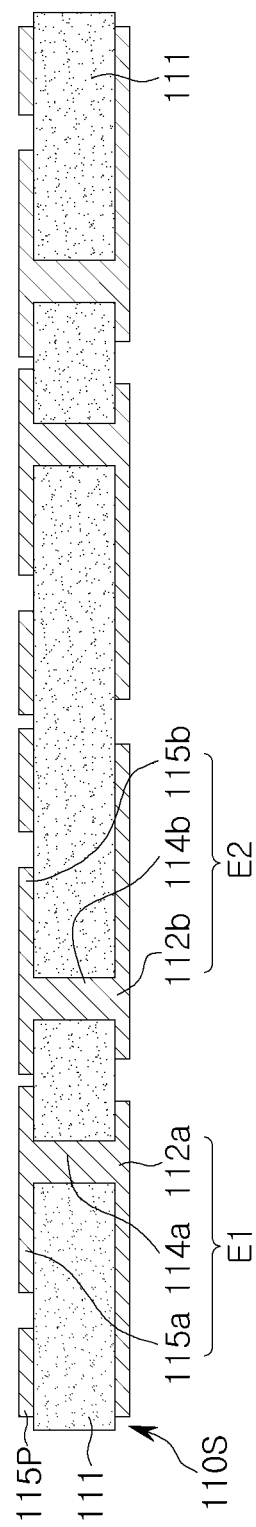
FIGS. 10 to 14 are plan views for each process for explaining a method of manufacturing a semiconductor light emitting device package according to an example embodiment of the present inventive concept.

Referring to FIG. 10, a base substrate 110S having a plurality of circuit boards 110 illustrated in FIG. 8 is provided.

The base substrate 110S may include a ceramic body 111. For example, the ceramic body 111 may include aluminum nitride, aluminum oxide, or silicon carbide. In some example embodiments, the ceramic body 111 may include aluminum nitride having excellent heat dissipation performance.

First and second electrode structures E1 and E2 may be formed in each of the circuit board regions. The first and second electrode structures E1 and E2 may include first and second upper pads 115a and 115b disposed on an upper surface of the ceramic body 111, respectively, first and second lower pads 112a and 112b disposed on a lower surface of the ceramic body 111, and first and second through electrodes 114a and 114b penetrating through the ceramic body 111 and respectively connecting the first and second upper pads 115a and 115b to the first and second lower pads 112a and 112b. The first and second electrode structures may include or be formed of a single-layer or multi-layer structure of conductive materials such as Au, Ag, Cu, Zn, Al, In, Ti, Si, Ge, Sn, Mg, Ta, Cr, W, Ru, Rh, Ir, Ni, Pd, and Pt. The first and second electrode structures E1 and E2 may be formed, for example, by a plating process using a metal such as copper Cu. The support pad 115P may be formed together with the first and second upper pads 115a and 115b (e.g., in a single plating process).

Figure 11:
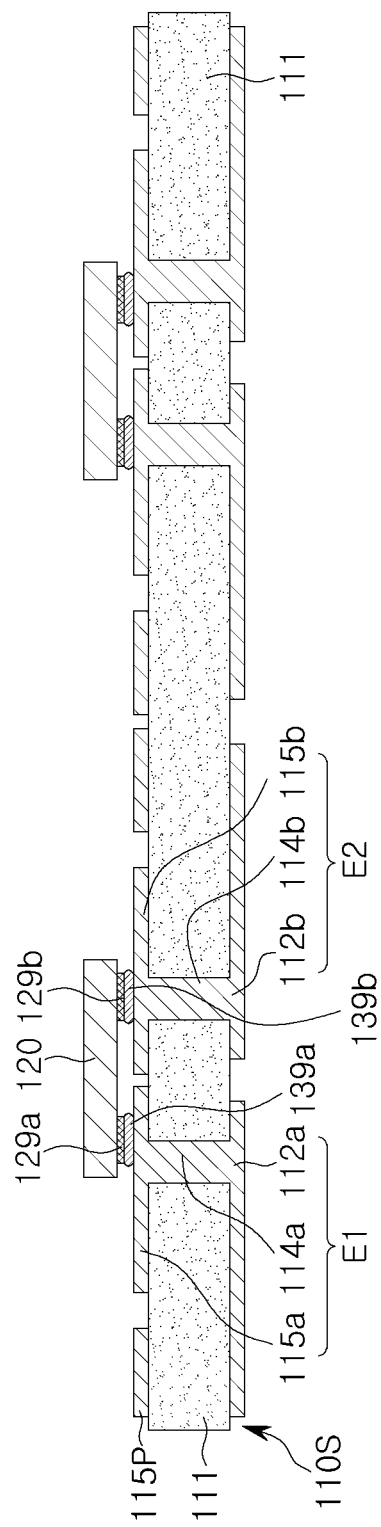

Subsequently, referring to FIG. 11, a plurality of LED chips 120 are mounted on a base substrate 110S, respectively.

A plurality of LED chips 120 may be mounted on the base substrate 110S so that the first and second electrodes 129a and 129b of the LED chip 120 are respectively connected to the first and second upper pads 115a and 115b using the connection bumps 139a and 139b. In the present example embodiment, it is illustrated that they are connected by a flip chip bonding method, but a flip chip may be directly bonded without the connection bumps 139a and 139b (e.g., an eutectic bonding method). A flux may be used for such eutectic bonding. In certain example embodiments (e.g., see FIGS. 5 and 6), an LED chip 120' may be bonded using wires.

Figure 12:
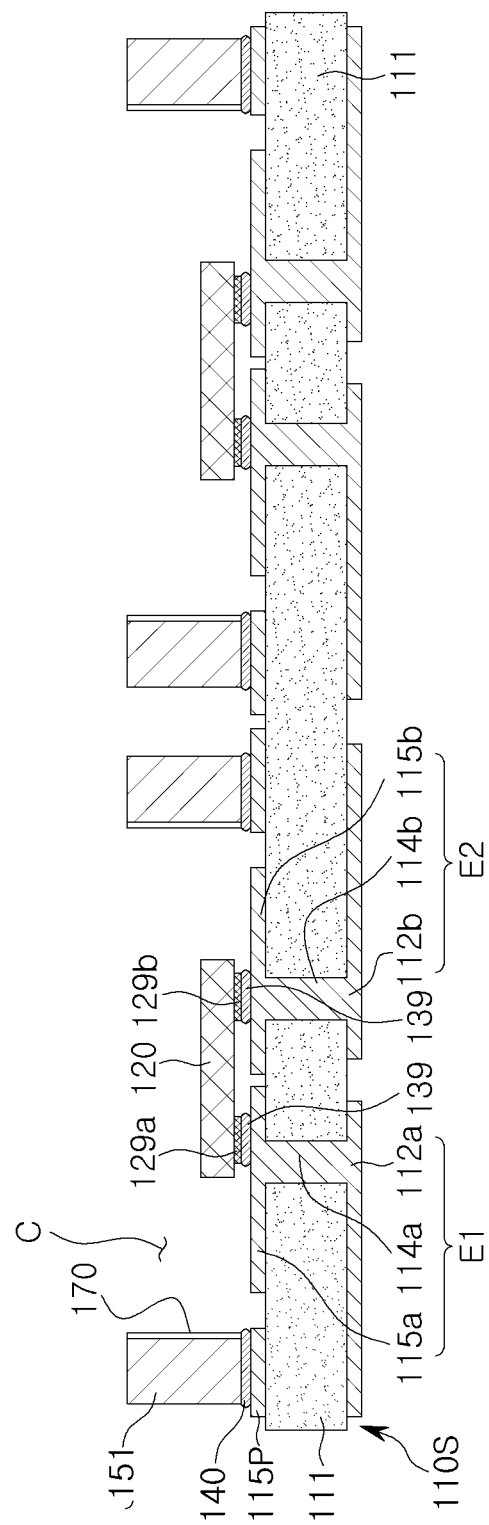
Figure 13:
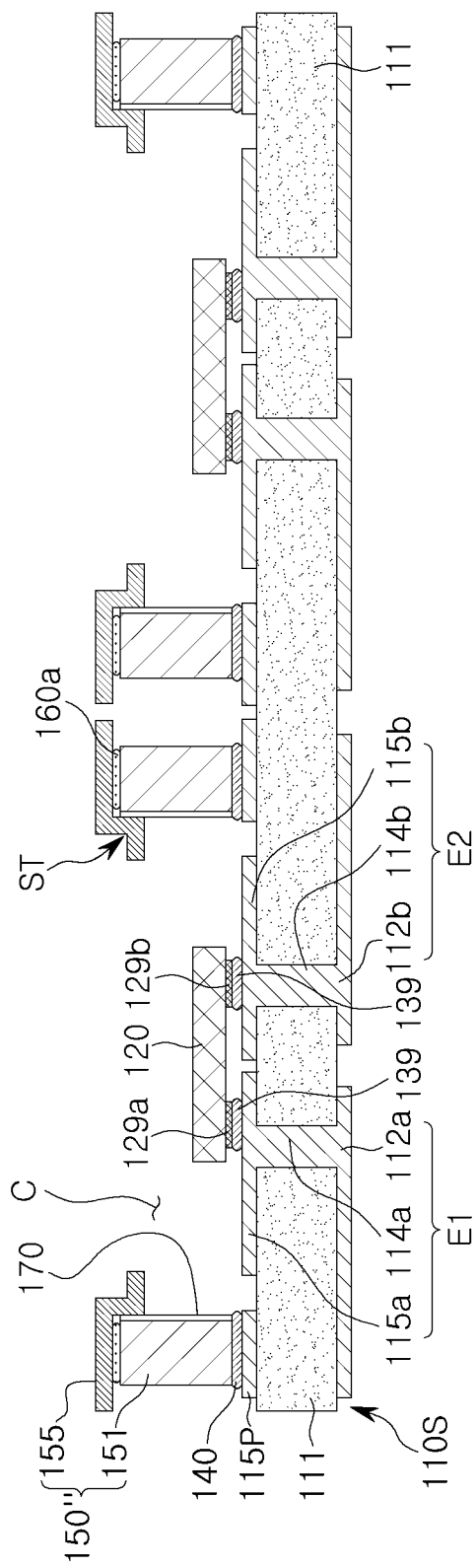
Figure 14:
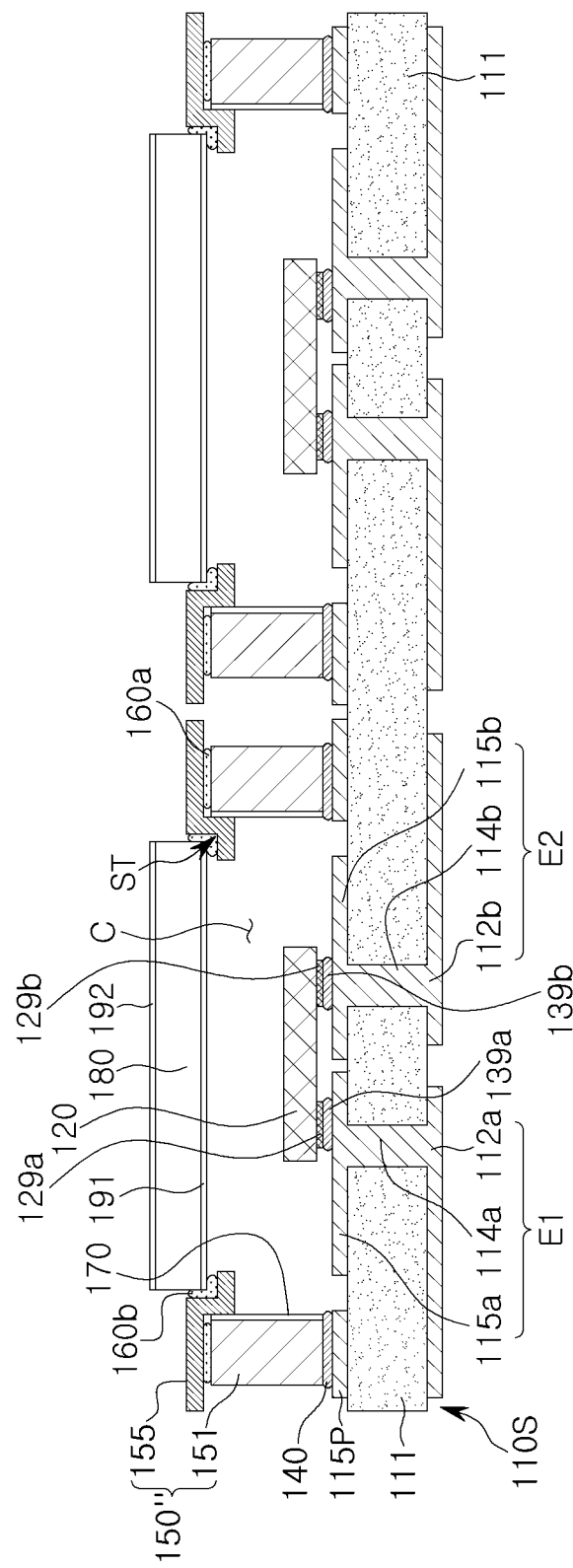

Next, referring to FIGS. 12-14, a main sidewall portion 150 for a sidewall structure is bonded on the base substrate 110S.

The sidewall structure employed in the present example embodiment may have a combined structure of a main sidewall portion 151 and a locking jaw portion (155 in FIG. 12), unlike the integrated sidewall structure. After disposing the first hermetic seal bonding layer 140 on the support pad 115P in advance, and disposing the main sidewall portion 151 on the hermetic seal bonding layer 140, a bonding process may be performed in such a method that heat is applied. Such bonding may be formed by one of brazing, welding, and soldering processes. As an example of the first hermetic seal bonding layer, in the case of a brazing method, an Ag-based filler may be used, in the case of welding, Ni/Au may be used, and in the case of a soldering method, eutectic metal such as Au/Ge, Au/In, and Au/Sn may be used.

An order of a process of bonding the LED chip 120 to the ceramic body 111 (FIG. 10) and a process of bonding the main sidewall portion 151 (FIG. 11) may be reversed. For example, as the bonding method of the main sidewall portion 151, a brazing method using an Ag-based filler may be used, and the LED chip 120 may be bonded after the main sidewall portion is first bonded. This is in order not to damage the LED chip 120 due to the heat required for the brazing bonding process.

Referring to FIG. 13, a desired sidewall structure 150" is prepared by bonding a locking jaw portion 155 on the main sidewall portion 151.

The locking jaw portion 155 may be bonded to an upper end of the main sidewall portion 151 using a second hermetic seal bonding layer 160a. The locking jaw portion 155 may have a stepped structure ST surrounding the cavity C (e.g., the locking jaw portion 155 may be a stepped ring structure). Glass frit or solder may be used for the second hermetic seal bonding layer 160a.

Together with the main sidewall portion 151, the locking jaw portion 155 may include an alloy having a thermal expansion coefficient of 10 ppm/° C. or less and a Young's modulus of 300 Gpa or less. The locking jaw may be made of the same alloy as the main sidewall portion. For example, the main sidewall portion 151 and the locking jaw portion 155 may include or may be formed of at least one of an Fe—Ni alloy, a Fe—Ni—Co alloy, and CuW. An Invar alloy may be used as the Fe—Ni alloy, and a Kovar alloy may be used as the Fe—Ni—Co alloy.

Next, referring to FIG. 14, the glass cover 180 may be disposed on a step (e.g., a stepped upper surface) of the stepped structure ST that constitutes the locking jaw portion 155 to be bonded thereto.

The glass cover 180 may be disposed on the stepped structure ST that constitutes the locking jaw portion 155 using a third hermetic seal bonding layer 160b. The third hermetic seal bonding layer 160b may include solder or glass frit, but is not limited thereto, and a resin-based bonding layer (a silicone resin or an epoxy resin) having a larger elastic modulus to protect the glass cover 180 can be used. First and second anti-reflective films 191 and 192 may be formed on a lower surface and an upper surface of the glass cover 180, respectively. For example, when the LED chip 120 emits seam ultraviolet light, the first and second anti-reflective films 191 and 192 may each use a material (e.g., $MgF_2$) film having a refractive index, close to 1.4, or a double structure of $MgF_2$ and $HfO_2$.

As set forth above, according to the present inventive concept, a semiconductor light emitting device package with a new structure having enhanced heat dissipation and high reliability may be provided as a wiring board, by forming a sidewall structure that provides a cavity (a mounting space) between a ceramic substrate with excellent heat dissipation performance as a circuit board and a glass cover with an alloy having an appropriate thermal expansion coefficient.

Various and advantageous advantages and effects of the present inventive concept are not limited to the above description, and they will be more readily understood in the process of describing the specific embodiments of the present inventive concept.

While the example embodiments have been shown and described above, it will be apparent to those skilled in the art that modifications and variations could be made without departing from the scope of the present invention as defined by the appended claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor light emitting device package, comprising:
    a ceramic substrate having first and second electrode structures;
    a light emitting diode chip mounted on the ceramic substrate, electrically connected to the first and second electrode structures, and configured to emit ultraviolet light;
    a sidewall structure disposed on the ceramic substrate, providing a cavity surrounding the light emitting diode chip, and including an alloy having a thermal expansion coefficient in a range of 2 to 10 ppm/° C. and a Young's modulus in a range of 100 to 300 Gpa; and
    a glass cover disposed on the sidewall structure to seal the cavity,
    wherein an upper portion of the sidewall structure has a stepped structure extending into the cavity.

2. The semiconductor light emitting device package of claim 1, wherein the ceramic substrate comprises a material having thermal conductivity of 100 W/m·K or more.

3. The semiconductor light emitting device package of claim 2, wherein the ceramic substrate comprises an aluminum nitride.

4. The semiconductor light emitting device package of claim 1, wherein the ceramic substrate comprises a support pad surrounding the light emitting diode chip on an upper surface of the ceramic substrate, and
    the semiconductor light emitting device package further comprises a hermetic seal bonding layer disposed between a lower surface of the sidewall structure and the support pad.

5. The semiconductor light emitting device package of claim 4, wherein the hermetic seal bonding layer is one of a brazing bonding layer, a welding bonding layer, and a soldering bonding layer.

6. The semiconductor light emitting device package of claim 1, further comprising a hermetic seal bonding layer disposed between an upper surface of the sidewall structure and the glass cover.

7. The semiconductor light emitting device package of claim 6, wherein the hermetic seal bonding layer comprises solder or glass frit.

8. The semiconductor light emitting device package of claim 1, wherein the sidewall structure comprises at least one of a Fe—Ni alloy, a Fe—Ni—Co alloy, and CuW.

9. The semiconductor light emitting device package of claim 1, wherein the alloy of the sidewall structure comprises has a thermal expansion coefficient in a range of 2 to 8 ppm/° C.

10. The semiconductor light emitting device package of claim 1, wherein the alloy of sidewall structure has a Young's modulus in a range of 100 to 200 Gpa.

11. The semiconductor light emitting device package of claim 1, wherein the sidewall structure comprises a reflective layer disposed on an inner sidewall surface thereof.

12. The semiconductor light emitting device package of claim 1, wherein the stepped structure surrounds the cavity, and the glass cover is disposed on a step of the stepped structure.

13. The semiconductor light emitting device package of claim 1, wherein the glass cover has a thermal expansion coefficient of 4 ppm/° C. or less.

14. The semiconductor light emitting device package of claim 1, further comprising a bonding layer between a lower surface of the sidewall structure and an upper surface of the ceramic substrate.

15. A semiconductor light emitting device package, comprising: a ceramic substrate having first and second electrode structures;
    a light emitting diode chip mounted on the ceramic substrate, electrically connected to the first and second electrode structures, and configured to emit ultraviolet light;
    a sidewall structure disposed on the ceramic substrate, and providing a cavity surrounding the light emitting diode chip, the sidewall structure including an alloy having a thermal expansion coefficient in a range of 2 to 10 ppm/° C. and a Young's modulus in a range of 100 to 300 Gpa;
    a first hermetic seal bonding layer disposed between a lower surface of the sidewall structure and an upper surface of the ceramic substrate;
    a glass cover disposed on the sidewall structure, and including a glass material having a thermal expansion coefficient in a range of 0.5 to 4 ppm/° C.; and
    a second hermetic seal bonding layer disposed between an upper surface of the sidewall structure and the glass cover,
    wherein an upper portion of the sidewall structure has a stepped structure extending into the cavity.

16. The semiconductor light emitting device package of claim 15, wherein the light emitting diode chip is configured to emit ultraviolet light having a wavelength in a range of 100 nm to 300 nm,
    wherein the glass material of the glass cover has a transmittance of 70% or more in a band of 200 nm to 300 nm.

17. The semiconductor light emitting device package of claim 15, wherein the ceramic substrate comprises a support pad surrounding the light emitting diode chip on an upper surface of the ceramic substrate, and
    wherein the first hermetic seal bonding layer is disposed between the support pad and the lower surface of the sidewall structure.

18. The semiconductor light emitting device package of claim 17, wherein the first and second electrode structures comprise first and second upper pads disposed on the upper surface of the ceramic substrate, first and second lower pads disposed on the lower surface of the ceramic substrate, and first and second through electrodes connecting the first and second upper pads to the first and second lower pads,
    wherein the first and second upper pads comprise a metal layer, and the support pad comprises the same metal layer as the metal layer of the first and second upper pads, respectively.

19. The semiconductor light emitting device package of claim 15, wherein the ceramic substrate comprises an aluminum nitride, and the sidewall structure comprises a Fe—Ni—Co alloy.

20. A semiconductor light emitting device package, comprising:
    a circuit board having a ceramic body including an aluminum nitride, first and second electrode pads, and a support pad, the support pad surrounding the first and second electrode pads, wherein the first and second electrode pads and the support pad are formed on an upper surface of the ceramic body;

a light emitting diode chip mounted on the circuit board, electrically connected to the first and second electrode pads, and configured to emit ultraviolet light;

a sidewall structure disposed on the circuit board, providing a cavity surrounding the light emitting diode chip, and including any one of a Fe—Ni alloy, a Fe—Ni—Co alloy, and CuW; and a glass cover disposed on the sidewall structure to seal the cavity, wherein the cavity has an internal space sealed by a first hermetic seal bonding layer disposed between an upper surface of the support pad and a lower surface of the sidewall structure and a second hermetic seal bonding layer disposed between an upper surface of the sidewall structure and the glass cover, and wherein an upper portion of the sidewall structure has a stepped structure extending into the cavity.

* * * * *